(12) United States Patent
Ford et al.

(10) Patent No.: US 10,217,951 B2
(45) Date of Patent: Feb. 26, 2019

(54) HIGH MOBILITY POLYMER ORGANIC FIELD-EFFECT TRANSISTORS BY BLADE-COATING SEMICONDUCTOR:INSULATOR BLEND SOLUTIONS

(71) Applicant: The Regents of the University of California, Oakland, CA (US)

(72) Inventors: Michael J. Ford, Santa Barbara, CA (US); Guillermo C. Bazan, Santa Barbara, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 5 days.

(21) Appl. No.: 15/241,949

(22) Filed: Aug. 19, 2016

(65) Prior Publication Data
US 2017/0054096 A1 Feb. 23, 2017

Related U.S. Application Data

(60) Provisional application No. 62/207,707, filed on Aug. 20, 2015, provisional application No. 62/262,025, filed on Dec. 2, 2015.

(51) Int. Cl.
*H01L 51/05* (2006.01)
*C08G 61/12* (2006.01)
*H01L 51/00* (2006.01)

(52) U.S. Cl.
CPC ........ *H01L 51/0558* (2013.01); *C08G 61/126* (2013.01); *H01L 51/0003* (2013.01);
(Continued)

(58) Field of Classification Search
CPC ............ C08G 2261/212; C08G 61/126; C08G 2261/1646; C08G 2261/13;
(Continued)

(56) References Cited

U.S. PATENT DOCUMENTS

2015/0214486 A1* 7/2015 Tseng ................. H01L 51/0012
257/40

FOREIGN PATENT DOCUMENTS

WO WO 2014039847 * 3/2014

OTHER PUBLICATIONS

Qiu, L., et al., "Organic Thin-Film Transistors Based on Blends of Poly(3-hexylthiophene) and Polystyrene with a Solubility-Induced Low Percolation Threshold", Chem. Mater., 2009, pp. 4380-4386, vol. 21.*

(Continued)

*Primary Examiner* — Tom Thomas
*Assistant Examiner* — Benjamin Tzu-Hung Liu
(74) *Attorney, Agent, or Firm* — Gates & Cooper LLP

(57) ABSTRACT

Conjugated polymer-based organic field-effect transistors have garnered attention since the solution processability of the semiconductor material raises the possibility of lower device fabrication costs, and considerable progress has been made on achieving high mobility systems. Further improvements in charge carrier mobility while using non-specialized deposition techniques and minimizing the volume of semiconductor used in the fabrication process are important considerations for practical implementation. Here, a method of fabricating devices is disclosed that uses a technique (for example, a scalable blade-coating technique) to cast polymer thin film devices from blend solutions with one component being the polymer semiconductor and the other being a commodity polymer. Even when mixing the semiconduct- (Continued)

ing polymer with 90% polystyrene by weight, an average mobility of 2.7±0.4 $cm^2$ $V^{-1}$ $s^{-1}$ can be obtained.

20 Claims, 4 Drawing Sheets

(52) U.S. Cl.
CPC ...... *H01L 51/0026* (2013.01); *H01L 51/0035* (2013.01); *H01L 51/0036* (2013.01); *H01L 51/0043* (2013.01); *C08G 2261/12* (2013.01); *C08G 2261/13* (2013.01); *C08G 2261/1646* (2013.01); *C08G 2261/18* (2013.01); *C08G 2261/212* (2013.01); *C08G 2261/228* (2013.01); *C08G 2261/3243* (2013.01); *C08G 2261/3246* (2013.01); *C08G 2261/51* (2013.01); *C08G 2261/92* (2013.01); *H01L 51/0097* (2013.01)

(58) Field of Classification Search
CPC .......... C08G 2261/228; C08G 2261/12; C08G 2261/3246; C08G 2261/51; C08G 2261/3243; C08G 2261/92; H01L 51/0003; H01L 51/0026; H01L 51/0035; H01L 51/0036; H01L 51/0043; H01L 51/0097; H01L 51/0558
See application file for complete search history.

(56) References Cited

OTHER PUBLICATIONS

Scaccabarozzi, A.D., et al., "Semiconducting:insulating polymer blends for optoelectronic applications—a review of recent advances", Journal of Materials Chemistry A, 2014, pp. 10818-10824, vol. 2.
Goffri, S., et al., "Multicomponent semiconducting polymer systems with low crystallization-induced percolation threshold", Nature Materials, Dec. 2006, pp. 950-956, vol. 5.
Babel, A., et al., "Morphology and Field-Effect Mobility of Charge Carriers in Binary Blends of Poly(3-hexylthiophene) with Poly[2-methoxy-5-(2-ethylhexoxy)-1,4-phenylenevinylene] and Polystyrene", Macromolecules, 2004, pp. 9835-9840, vol. 37.
Qiu, L., et al., "Organic Thin-film Transistors Based on Polythiophene Nanowires Embedded in Insulating Polymer", Advanced Materials, 2009, pp. 1349-1353, vol. 21.
Chang, M., et al., "Macroscopic Alignment of One-Dimensional Conjugated Polymer Nanocrystallites for High-Mobility Organic Field-Effect Transistors", ACS Applied Materials & Interfaces, 2016, pp. 13484-13491, vol. 8.
Lu, G., et al., "Moderate doping leads to high performance of semiconductor/insulator polymer blend transistors", Nature Communications, 2013, pp. 1-8, vol. 4, No. 1588, DOI: 10.1038/ncomms2587.
Lim, J.A., et al., "Inkjet-Printed Single-Droplet Organic Transistors Based on Semiconductor Nanowires Embedded in Insulating Polymers", Advanced Functional Materials, 2010, pp. 3292-3297, vol. 20.
Qiu, L., et al., "Versatile Use of Vertical-Phase-Separation-Induced Bilayer Structures in Organic Thin-Film Transistors**", Advanced Materials, 2008, pp. 1141-1145, vol. 20.
Salleo, A., et al., "Solution Based Self-Assembly of an Array of Polymeric Thin-Film Transistors**", Advanced Materials, 2007, pp. 3540-3543, vol. 19.
Arias, A.C., et al., "Surface-Induced Self-Encapsulation of Polymer Thin-Film Transistors**", Advanced Materials, 2006, pp. 2900-2904, vol. 18.
Murphy, C.E., et al., "Wire-bar coating of semiconducting polythiophene/insulating polyethylene blend thin films for organic transistors", Journal of Applied Physics, 2011, pp. 093523-1-093523-7, vol. 110.
Diao et al., Morphology control strategies for solution-processed organic semiconductor thin films. Energy Environ. Sci., 2014, 7, pp. 2145-2159.
Dibenedetto et. al., "Molecular Self-Assembled Monolayers and Multilayers for Organic and Unconventional Inorganic Thin-Film Transistor Applications". Adv. Mater. 2009, 21, pp. 1407-1433.
Dimitrakopoulos et al., "Organic Thin Film Transistors for Large Area Electronics". Adv. Mater. 2002, 14, pp. 99-117.
Tsao et al., "Ultrahigh Mobility in Polymer Field-Effect Transistors by Design". J. Am. Chem. Soc. 2011, 133, pp. 2605-2612.
Ying et al. "Regioregular Pyridal[2,1,3] thiadiazole Congjugated Copoloymers". J. Am. Chem. Soc. 2011, 133, pp. 18538-18541.
Phan et al., "Electrical Instability Induced by Electron Trapping in Low-Bandgap Donor-Acceptor Polymer Field-Effect Transistors". Adv. Mater. 2015, Published online Oct. 6, 2015, pp. 7004-7009.
Yuan et al., "Ultra-high mobility transparent organic thin film transistors grown by an off-centre spin-coating method". Nat. Comm. 2014, 5, pp. 1-9.

* cited by examiner

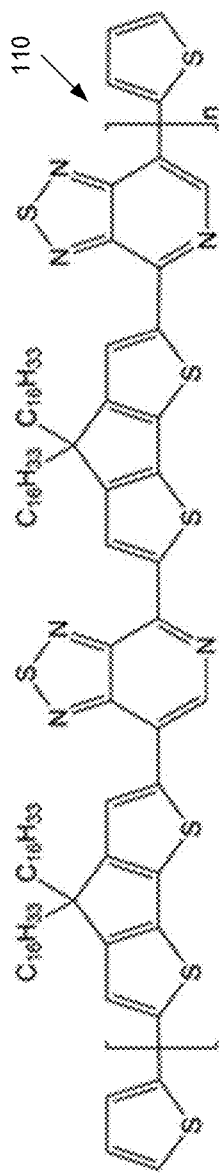
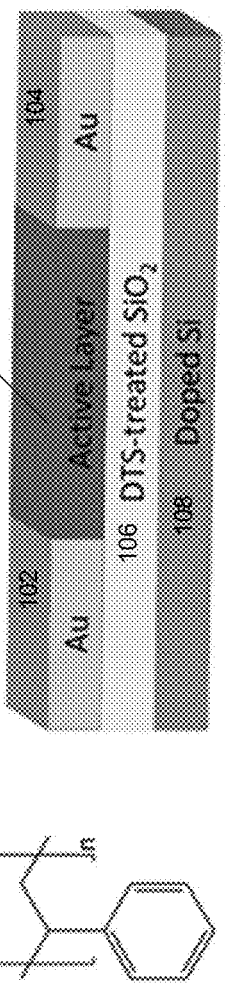
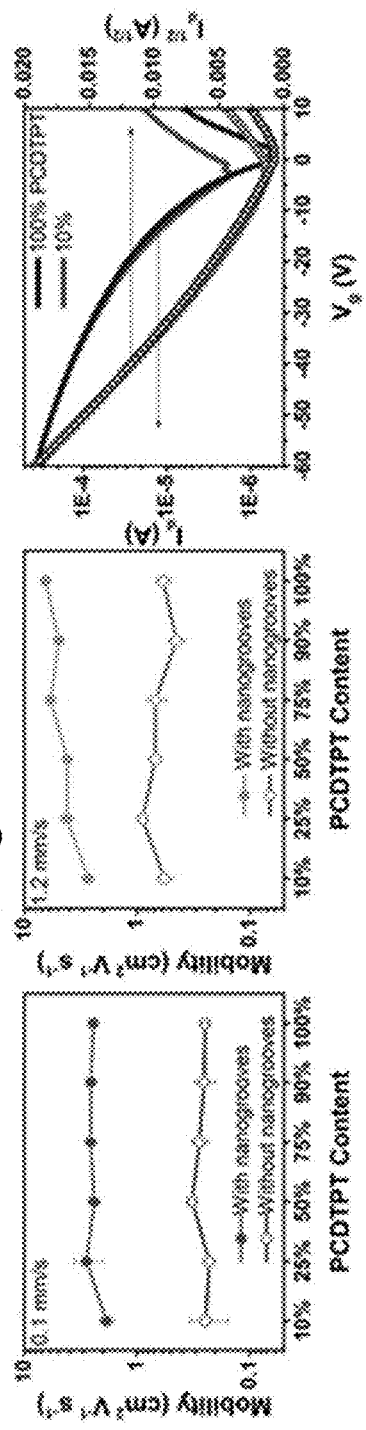
Figure 1a
Figure 1b
Figure 1c
Figure 1d
Figure 1e
Figure 1f

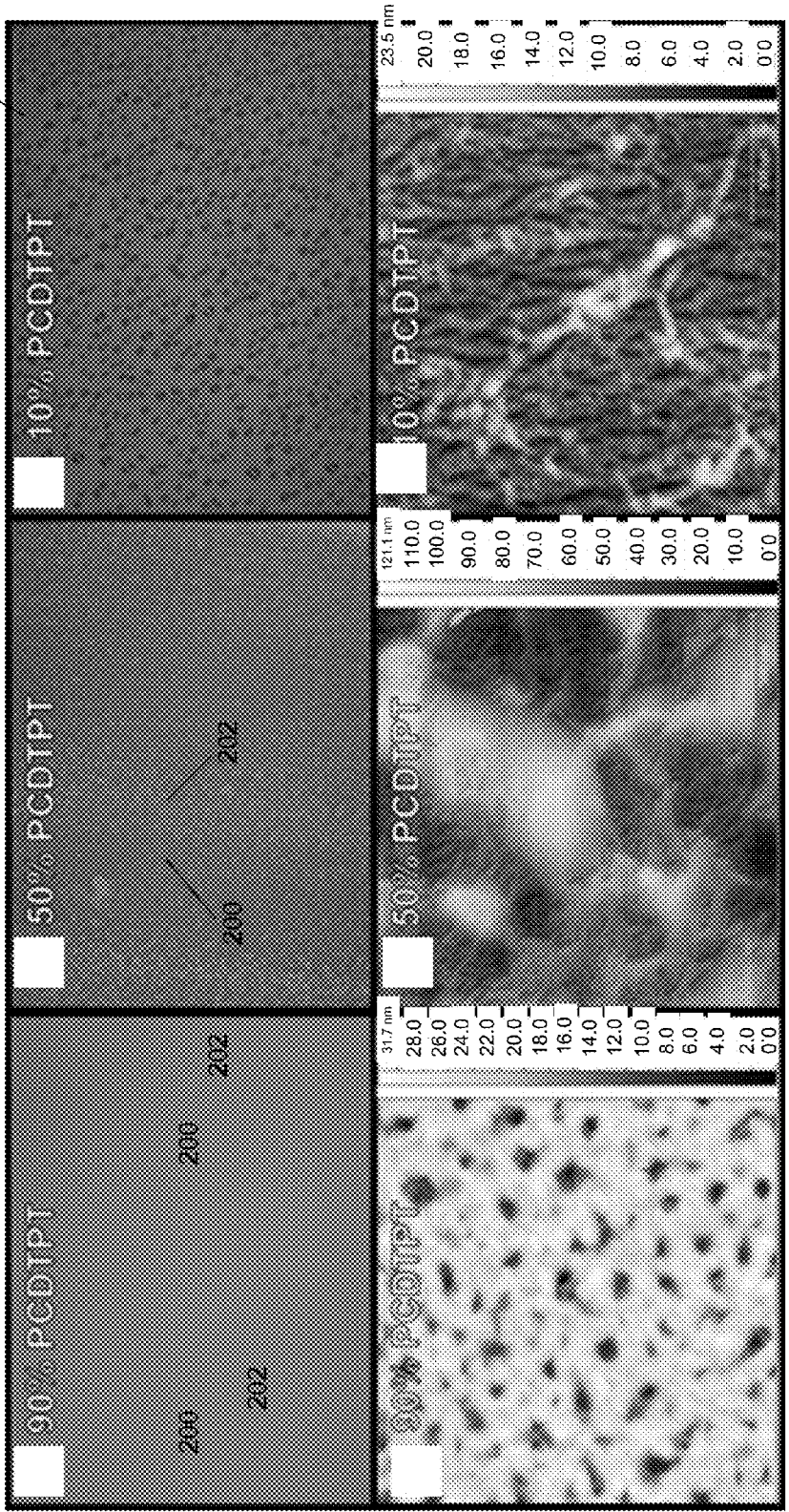
*Figure 2a* *Figure 2b* *Figure 2c*
*Figure 2d* *Figure 2e* *Figure 2f*

HIGH MOBILITY POLYMER ORGANIC FIELD-EFFECT TRANSISTORS BY BLADE-COATING SEMICONDUCTOR:INSULATOR BLEND SOLUTIONS

CROSS REFERENCE TO RELATED APPLICATIONS

This application claims the benefit under 35 U.S.C. Section 119(e) of commonly-assigned U.S. applications:

U.S. Provisional Patent Application No. 62/207,707, filed Aug. 20, 2015, by Michael Ford and Guillermo Bazan, entitled "HIGH MOBILITY POLYMER ORGANIC FIELD-EFFECT TRANSISTORS BY BLADE-COATING SEMICONDUCTOR: INSULATOR BLEND SOLUTIONS"; and U.S. Provisional Patent Application No. 62/262,025, filed Dec. 2, 2015, by Michael Ford and Guillermo Bazan, entitled "HIGH MOBILITY POLYMER ORGANIC FIELD-EFFECT TRANSISTORS BY BLADE-COATING SEMICONDUCTOR: INSULATOR BLEND SOLUTIONS";

which applications are incorporated by reference herein.

This application is related to the following commonly-assigned U.S. patent applications:

U.S. Provisional Patent Application No. 62/367,401, filed Jul. 27, 2016, by Colin R. Bridges, Michael J. Ford, Guillermo C. Bazan, and Rachel A. Segalman, entitled "FORMATION AND STRUCTURE OF LYOTROPIC LIQUID CRYSTALLINE MESOPHASES IN DONOR-ACCEPTOR SEMICONDUCTING POLYMERS";

U.S. Provisional Patent Application No. 62/338,866, filed May 19, 2016, by Michael J. Ford, Hengbin Wang, and Guillermo Bazan, entitled "ORGANIC SEMICONDUCTOR SOLUTION BLENDS FOR SWITCHING AMBIPOLAR TRANSPORT TO N-TYPE TRANSPORT";

U.S. Provisional Patent Application No. 62/327,311, filed Apr. 25, 2016, by Guillermo Bazan and Ming Wang, entitled "NOVEL WEAK DONOR-ACCEPTOR CONJUGATED COPOLYMERS FOR FIELD-EFFECT TRANSISTOR APPLICATIONS";

U.S. Provisional Patent Application No. 62/276,145, filed Jan. 7, 2016, by Michael J. Ford and Guillermo Bazan, entitled "STABLE ORGANIC FIELD-EFFECT TRANSISTORS BY INCORPORATING AN ELECTRON-ACCEPTING MOLECULE";

U.S. Provisional Patent Application No. 62/253,975, filed Nov. 11, 2015, by Ming Wang and Guillermo Bazan, entitled "FLUORINE SUBSTITUTION INFLUENCE ON BENZO[2,1,3]THIODIAZOLE BASED POLYMERS FOR FIELD-EFFECT TRANSISTOR APPLICATIONS";

U.S. Provisional Patent Application No. 62/263,058, filed Dec. 4, 2015, by Byoung Hoon Lee, Ben B. Y. Hsu, Chan Luo, Ming Wang, Guillermo Bazan, and Alan J. Heeger, entitled "SEMICONDUCTING POLYMERS WITH MOBILITY APPROACHING ONE HUNDRED SQUARE CENTIMETERS PER VOLT PER SECOND";

U.S. Provisional Patent Application No. 62/214,076, filed Sep. 3, 2015, by Byoung Hoon Lee and Alan J. Heeger, entitled "DOPING-INDUCED CARRIER DENSITY MODULATION IN POLYMER FIELD EFFECT TRANSISTORS";

U.S. Utility application Ser. No. 15/213,029 filed on Jul. 18, 2016 by Byoung Hoon Lee and Alan J. Heeger, entitled "FLEXIBLE ORGANIC TRANSISTORS WITH CONTROLLED NANOMORPHOLOGY", which application claims the benefit under 35 U.S.C. Section 119(e) of U.S. Utility U.S. Provisional Application Ser. No. 62/193,909 filed on Jul. 17, 2015 by Byoung Hoon Lee and Alan J. Heeger, entitled "FLEXIBLE ORGANIC TRANSISTORS WITH CONTROLLED NANOMORPHOLOGY";

U.S. Utility patent application Ser. No. 15/058,994, filed Mar. 2, 2016, by Shrayesh N. Patel, Edward J. Kramer, Michael L. Chabinyc, Chan Luo and Alan J. Heeger, entitled "BLADE COATING ON NANOGROOVED SUBSTRATES YIELDING ALIGNED THIN FILMS OF HIGH MOBILITY SEMICONDUCTING POLYMERS," which Application claims the benefit under 35 U.S.C. Section 119(e) of U.S. Provisional Patent Application No. 62/127,116, filed Mar. 2, 2015, by Shrayesh N. Patel, Edward J. Kramer, Michael L. Chabinyc, Chan Luo and Alan J. Heeger, entitled "BLADE COATING ON NANOGROOVED SUBSTRATES YIELDING ALIGNED THIN FILMS OF HIGH MOBILITY SEMICONDUCTING POLYMERS";

U.S. Utility patent application Ser. No. 14/585,653, filed on Dec. 30, 2014, by Chan Luo and Alan Heeger, entitled "HIGH MOBILITY POLYMER THIN FILM TRANSISTORS WITH CAPILLARITY MEDIATED SELF-ASSEMBLY", which application claims the benefit under 35 U.S.C. Section 119(e) of U.S. Provisional Patent Application Ser. No. 61/923,452, filed on Jan. 3, 2014, entitled "HIGH MOBILITY POLYMER THIN FILM TRANSISTORS WITH CAPILLARITY MEDIATED SELF-ASSEMBLY";

U.S. Utility patent application Ser. No. 14/426,467, filed on Mar. 6, 2015, by Hsing-Rong Tseng, Lei Ying, Ben B. Y. Hsu, Christopher J. Takacs, and Guillermo C. Bazan, entitled "FIELD-EFFECT TRANSISTORS BASED ON MACROSCOPICALLY ORIENTED POLYMERS," which application claims the benefit under 35 U.S.C. § 365 of PCT International patent application serial no. PCT/US13/058546 filed Sep. 6, 2013, which application claims the benefit under 35 U.S.C. Section 119(e) of U.S. Provisional Patent Application Ser. No. 61/698,065, filed on Sep. 7, 2012, and 61/863,255, filed on Aug. 7, 2013, entitled "FIELD-EFFECT TRANSISTORS BASED ON MACROSCOPICALLY ORIENTED POLYMERS";

all of which applications are incorporated by reference herein.

BACKGROUND OF THE INVENTION

1. Field of the Invention

This invention relates to a method for increasing mobility of polymer blends.

2. Description of the Related Art (Note: This application references a number of different publications as indicated throughout the specification by one or more reference numbers in bracketed superscripts [x]. A list of these different publications ordered according to these reference numbers can be found below in the section entitled "References." Each of these publications is incorporated by reference herein.)

Conjugated polymer-based organic field-effect transistors (OFETs) are of interest since the solution processability of the semiconductor material raises the possibility of lower device fabrication costs.[1] Markedly improved device performances (since their initial development) suggests commercial viability.[2-5] Substantial progress has been achieved on the design of high mobility polymers and small molecules by tuning molecular structure.[6,7] Processing conditions and device architecture have also been modified to achieve high mobility.[1,8-13] Further improvements in OFET processing, for example by using non-specialized deposition techniques and by minimizing the volume of semiconductor included in the fabrication process while keeping relevant OFET performance, are also important considerations when considering practical implementation and widespread impact.[14,15]

One strategy for improving operational properties and lowering the cost of organic electronic devices has been to combine the optoelectronic properties of the organic semiconductor with a commodity insulating polymer.[15-26] In addition to reducing materials costs, these commonly-available polymers have the potential to enhance environmental stability and improve mechanical properties when blended with the semiconductor component.[15,16] Multicomponent OFETs have been studied, and these efforts lay the foundation for understanding blend strategies, the impact of dilution on charge carrier transport, and the specific challenges for implementation. An early study demonstrated that the hole mobility for pristine poly(3-hexylthiophene) (P3HT) was in a range from 0.008-0.02 $cm^2V^{-1} s^{-1}$, while devices fabricated from a solution of 90% P3HT/10% polystyrene (PS) had a mobility decreased to $5.5 \times 10^{-3} cm^2V^{-1} s^{-1}$.[17] More recently, insulator composition-independent mobility has been achieved in other systems through a variety of processing modifications. For example, by blending 5 wt % poly[2,5-bis(3-tetradecylthiophen-2-yl)thieno[3,2-b]thiophene] (PBTTT) with PS and in the presence of TCNQ, mobilities of 0.4 $cm^2V^{-1} s^{-1}$ were obtained, which are among the highest for all-polymer, majority-insulator OFETs.[20]

SUMMARY OF THE INVENTION

One or more embodiments of the present invention disclose a novel OFET with a surprisingly reduced composition of semiconducting polymers in the channel region. The OFET comprises a film comprising semiconducting polymers and insulating polymers, wherein a total weight ($W_{IP}$) of the insulating polymers in the film is at least 50% of a total weight ($W_{TOT}$) of the film, a total weight the semiconducting polymers in the film is at most 50% of the total weight of the film ($W_{TOT}$), and the semiconducting polymers each have a donor-acceptor copolymer backbone. The OFET further comprises a source contact and a drain contact to the semiconducting polymers; a gate contact; and a dielectric between the gate contact and the semiconducting polymers.

The OFET can be embodied in many ways, including, but not limited to the following.

1. $W_{IP}$ being at least 90% of the total weight ($W_{TOT}$).
2. The film being cast on the dielectric from a solution comprising a first concentration of the semiconducting polymers in a solvent and a second concentration of the insulating polymers in the solvent, such that a mobility of the OFET, in a saturation regime, is reduced by no more than 10% when a concentration of the insulating polymers in the solvent is increased from zero to the second concentration (the first concentration of the semiconducting polymers remaining the same, or the total concentration of the blends remaining the same).
3. The weight of the insulating polymers being such that the OFET has a mobility in a saturation regime of at least 2.7 $cm^2V^{-1} s^{-1}$.
4. In any of the preceding embodiments 1-3, the insulating polymer comprising a commodity polymer such as polystyrene (PS).
5. In any of the preceding embodiments 1-4, the semiconducting polymers comprising a conjugated main chain section, said conjugated main chain section comprising a plurality of donor and acceptor units.
6. In any of the preceding embodiments 1-5, the semiconducting polymers comprising a conjugated main chain section, said conjugated main chain section having a repeat unit that comprises at least one acceptor structure selected from:

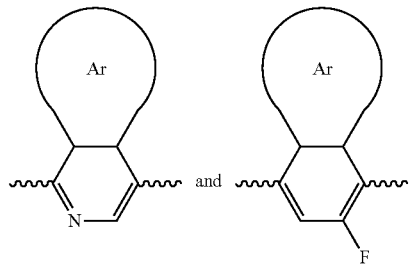

wherein Ar is a substituted or non-substituted aromatic functional group, or Ar is nothing and the valence of the pyridine ring is completed with hydrogen or the valence of the fluorobenzene ring is completed with hydrogen. Said acceptor structures can be regioregularly arranged along the conjugated main chain section.

7. In the embodiment 6, the pyridine unit comprising:

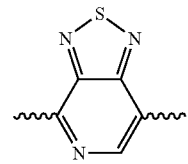

8. In the embodiment 6, the fluorinated unit comprising:

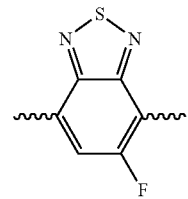

9. In the embodiments 5-9, the repeat unit further comprising a dithiophene of the structure:

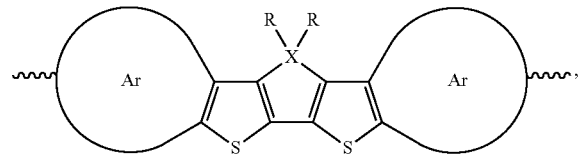

wherein each Ar is independently a substituted or non-substituted aromatic functional group, or each Ar is independently nothing and the valence of its respective thiophene ring is completed with hydrogen, each R is independently hydrogen or a substituted or non-substituted alkyl, aryl or alkoxy chain; and X is C, Si, Ge, N or P.

10. In the embodiment 5, the semiconducting polymer is regioregular poly[4-(4,4-dihexadecyl-4H-cyclopenta[1,2-b:

5,4-b']dithiophen-2-yl)-alt-[1,2,5]thiadiazolo[3,4-c]pyridine] (PCDTPT, abbreviation name P2).

11. In the embodiment 5, the semiconducting polymer is regioregular poly[4-(4,4-dihexadecyl-4H-cyclopenta[1,2-b:5,4-b']dithiophen-2-yl)-6-fluorobenzo[c][1,2,5]thiadiazole] (PCDTFBT).

12. In the embodiment 5, the semiconducting polymer has the following structure:

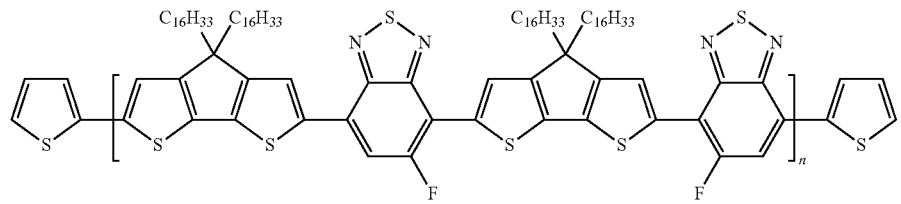

13. In the embodiment 5, the charge carrier mobility and thin film morphology of organic field-effect transistors cast from a mixture of the insulating component (polystyrene) and the regioregular narrow band gap conjugated polymer PCDTPT is investigated.

14. In any of the preceding embodiments 1-13, the film being blade coated from a solution onto the dielectric.

15. In any of the preceding embodiments 1-14, a π-π stacking of the semiconducting polymers in the film being characterized by a peak having a full width at half maximum of 0.1 Å$^{-1}$ or less, as measured by a grazing incidence wide-angle X-ray scattering (GIWAXS) measurement of the film.

16. In any of the preceding embodiments 1-15, the film comprising a polymer blend of the semiconducting polymers and the insulating polymers; the semiconducting polymers and the insulating polymers being phase separated in the film and forming separate domains; the semiconducting polymers including a plurality of interconnected polymer chains.

17. In any of the preceding embodiments 1-16, the dielectric comprising nanogrooves aligning the semiconducting polymers to an alignment direction in the channel. By introducing polymer alignment, a mobility of 2.7±0.4 cm$^2$V$^{-1}$ s$^{-1}$ can be obtained in films cast from solutions containing only 10% PCDTPT.

18. In any of the preceding embodiments 1-17, the semiconducting polymers comprising aligned semiconducting polymer chains in a crystalline state.

Also disclosed is a method of fabricating the OFET of any of the embodiments described above. In one or more embodiments, the method comprises selecting a composition of the insulating polymers, a composition of the semiconducting polymers, the solution comprising a first concentration of the semiconducting polymers in a solvent and a second concentration of the insulating polymers in the solvent; selecting a blade coating speed and a blade coating temperature for the blade coating; and selecting an annealing temperature for the annealing; wherein a mobility of the OFET, in a saturation regime, is reduced by no more than 10% when a concentration of the insulating polymer in the solvent is increased from zero to the second concentration (the first concentration of the semiconducting polymer remaining the same), blade coating the film from a solution on the dielectric comprising nanogrooves, at a speed of at least 0.1 to 1 mm/s at a temperature of at least 50 to 100 degrees Celsius.

BRIEF DESCRIPTION OF THE DRAWINGS

Referring now to the drawings in which like reference numbers represent corresponding parts throughout:

FIG. 1a shows chemical structure of PCDTPT used in one or more embodiments of the invention.

FIG. 1b shows chemical structure of polystyrene used in one or more embodiments of the invention.

FIG. 1c shows a cartoon of the device architecture used in one or more embodiments of the invention.

FIGS. 1d-1e show the mobility of PCDTPT:PS blend devices, according to one or more embodiments of the invention, at various ratios cast on substrates with and without nanogrooves fabricated using condition 1 (0.1 mm/s, 50° C.) (FIG. 1d) and condition 2 (1.2 mm/s, 100° C.) (FIG. 1e).

FIG. 1f shows transfer curves for selected devices cast under Condition 1 on substrates with nanogrooves, according to one or more embodiments of the invention.

FIGS. 2a-2c show characterization of the blend films' surfaces (according to one or more embodiments of the invention) by optical microscopy images at 31.5× magnification, wherein FIG. 2a shows the surface of a 90% PCDTPT blend, FIG. 2b shows the surface of a 50% PCDTPT blend, and FIG. 2c shows the surface of a 10% PCDTPT blend. The optical image sizes are 280 m wide. The PCDTPT thin film appears here as blue/green. A bare substrate appears dark purple FIGS. 2d-2f are Atomic Force Microscope (AFM) images of the blend films (according to one or more embodiments of the invention) with the height scale bars on the right of the image, wherein the AFM image dimensions are 2 m×2 m and the blend compositions in FIGS. 2a-2f are labelled with respect to PCDTPT weight percentage (FIG. 2d shows AFM of the 90% PCDTPT, FIG. 2e shows AFM of the 50% PCDTPT, and FIG. 2f shows AFM of the 10% PCDTPT).

FIGS. 3a-3b show data from GIWAXS used to investigate the effect of PS on π-stacking and order in PCDTPT crystallites according to one or more embodiments of the invention, wherein FIG. 3a and FIG. 3b show in-plane and out-of-plane grazing incidence scattering, respectively.

DETAILED DESCRIPTION OF THE INVENTION

Figures 3A, 3B:
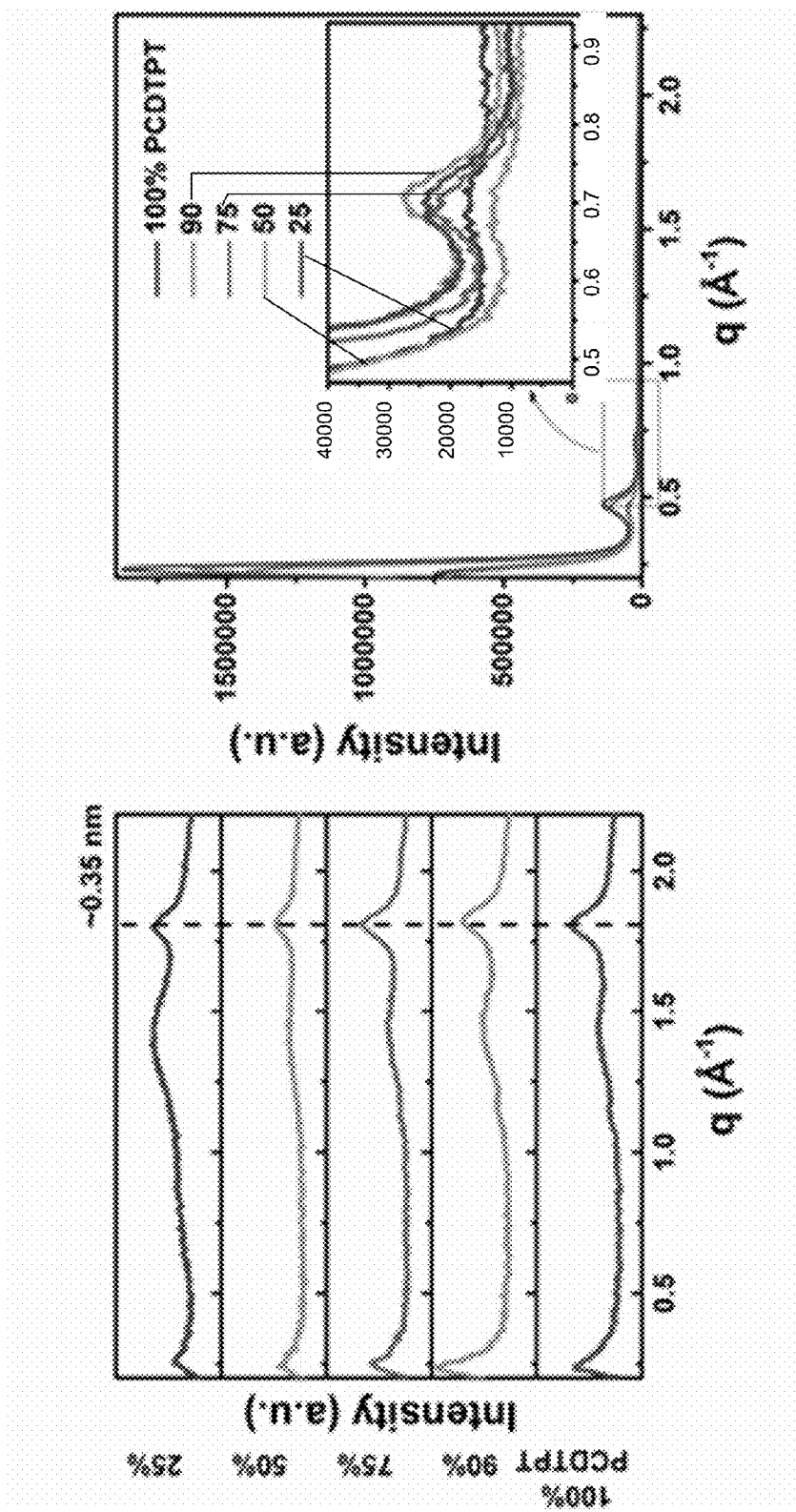

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

TECHNICAL DESCRIPTION

Introduction

With improvements in molecular design and device fabrication, higher mobilities may be possible. Moreover, donor-acceptor polymers, while well-studied and among the best performers in OPV and OFET applications, have not been fully explored within the context of polymer-insulator blends.[18-23]

Molecular order and alignment, together with the morphological characteristics of ordered and disordered domains, mediate OFET charge carrier mobility.[24-29] Introducing "nanogrooves", by scratching substrates with a diamond lapping film, was recently demonstrated to promote alignment and yield high-mobility devices using regioregular poly[4-(4,4-dihexadecyl-4H-cyclopenta[1,2-b:5,4-b']dithiophen-2-yl)-alt-[1,2,5]thiadiazolo[3,4-c]pyridine] (PCDTPT, see FIG. 1a, where high mobility charge transport is preferentially in the direction of alignment.[12,13,33] These results required a slow-drying "sandwich-cast" approach and a capillary action-induced deposition method, techniques that remain specialized and difficult to scale up. For example, two substrates with an area of 7 mm×12 mm can be cast during a single deposition, but subsequently require ~5 hours for complete solvent evaporation. A more scalable technique, such as blade-coating, would be more desirable. Depending on the deposition rate, active layers can be deposited by blade-coating within minutes.[34]

Example Structures

One or more embodiments of the present invention demonstrate that blade-coating can be used to fabricate conjugated donor-acceptor copolymer (PCDTPT) based OFETs that incorporate an amorphous insulating material (PS). These results also provide a description of electronic properties obtained from blade-coated semiconductor/PS blends deposited atop nanostructured substrates. Of particular interest is that the resulting devices exhibit fairly constant hole mobilities for semiconductor compositions; even for as low as 10% semiconductor one can obtain mobilities exceeding 1 $cm^2V^{-1}$ $s^{-1}$. Polystyrene dewetting after annealing allows for visualization of semiconductor fibre alignment. The overall approach provides a potentially widely useful alternative route for producing high-mobility, low-cost organic semiconductors.

Regioregular PCDTPT was synthesized according to previous procedures[35]. Films cast from PCDTPT/PS blends in chlorobenzene were deposited by blade-coating under two different processing conditions. Condition 1 is characterized by a slower coating speed and lower temperature (0.1 mm/s, 50° C.) relative to Condition 2 (1.2 mm/s, 100° C.). These conditions generated smooth, continuous films optimal for device testing and characterization. Too slow of a casting speed (e.g., 0.3 mm/s, 100° C.) resulted in increased solvent evaporation and rougher films, while films cast using too fast of a casting speed resulted in discontinuous films and lower device performance (Figure S1 in the Supporting Information[42]).

Films were cast onto substrates in the bottom-gate, bottom-contact device architecture (FIG. 1c) and were then annealed under nitrogen at 200° C. for 8 min.

FIG. 1c illustrates an OFET according to one or more embodiments, comprising a film (active layer or channel 100) comprising semiconducting polymers (such as those illustrated in FIG. 1a) and insulating polymers (such as those illustrated in FIG. 1b); a source contact 102 (e.g., Au), a drain contact 104 (e.g., Au) to the semiconducting polymers; a gate contact 106 (e.g., doped Si); and a dielectric 108 (e.g., DTS treated $SiO_2$) between the gate contact and the semiconducting polymers.

FIG. 1a illustrates the semiconducting polymers each having a donor-acceptor copolymer backbone on main chain axis 110. In one or more embodiments, the backbones 110 are aligned along/parallel to an axis direction 112 separating the source 102 from the drain 104.

Mobilities of the One or More Example Structures

At high gate voltage ($V_g$) and drain voltage ($V_d$), output characteristics typically did not demonstrate ideal saturation (Figure S2 and Figure S3 in the Supporting Information[42]). Therefore, the charge carrier mobility (μ) was calculated using the saturation regime equation within voltage regimes only where saturation is observed. These are conservative estimates for the mobility extracted in accordance with current recommended guidelines for mobility determination in OFETs,[5] particularly in view of the "double slope" behaviour observed in many high mobility systems, including previous reports on PCDTPT.[12,13,33]. PCDTPT also can exhibit a current instability phenomenon where the current and mobility increase after multiple scans[36]; therefore, to further avoid ambiguity of what is calculated, only the mobility from the first current-voltage scan (where minimal double slope is observed) is reported. For further discussion on this matter refer to the Supporting Information[42].

FIGS. 1d and 1e provide μ as a function of PCDTPT:PS ratio for the two different coating conditions, with and without nanogrooves. First, devices cast onto substrates without nanogrooves are discussed. Table 1 shows the average mobilities and standard deviation calculated for at least 3 devices for each blend composition cast under Condition 1. For these data, the μ values for 10 wt % PCDTPT devices (0.24±0.08 $cm^2V^{-1}$ $s^{-1}$) do not vary significantly from those obtained from neat PCDTPT devices (0.25±0.02 $cm^2V^{-1}$ $s^{-1}$). Processing with PS thus does not impact greatly the mobility of PCDTPT. For Condition 2, again without nanogrooved substrates, a similar trend occurs. The μ observed for 10 wt % PCDTPT devices (0.57±0.09 $cm^2V^{-1}$ $s^{-1}$) does not vary significantly from the mobility obtained for pristine PCDTPT devices (0.59±0.08 $cm^2V^{-1}$ $s^{-1}$).[35] Overall, a two-fold increase in μ was observed when modifying casting conditions from Condition 1 to Condition 2. That the higher blade-coating speed yields better performance is in agreement with previous studies that demonstrated how solution shearing at higher temperatures and speeds can produce higher mobilities.[37] Moreover, that μ is about 0.6 $cm^2V^{-1}$ $s^{-1}$ for both neat PCDTPT devices and 10% PCDTPT devices indicates good interconnectivity of semiconductor domains within the blend, at least within those regions of the film responsible for charge transport.

TABLE 1

Average mobility values and statistical information determined by using different blend composition, casting conditions, and dielectric modifications.

| Conditions | Average Value | 10% | 25% | 50% | 75% | 90% | 100% PCDTPT |
|---|---|---|---|---|---|---|---|
| Condition 1 | Without nanogrooves Mobility [$cm^2 V^{-1} s^{-1}$] | 0.25 ± 0.08 | 0.23 ± 0.03 | 0.33 ± 0.03 | 0.28 ± 0.06 | 0.25 ± 0.05 | 0.25 ± 0.02 |
| | With nanogrooves Mobility [$cm^2 V^{-1} s^{-1}$] | 1.9 ± 0.3 | 2.8 ± 0.8 | 2.4 ± 0.3 | 2.6 ± 0.1 | 2.6 ± 0.2 | 2.5 ± 0.2 |
| | Mobility anisotropy of nanogrooved devices [$\mu_{para}/\mu_{perp}$] | 9.5 | 14.7 | 11.4 | 11.3 | 11.3 | 11.4 |
| Condition 2 | Without nanogrooves Mobility [$cm^2 V^{-1} s^{-1}$] | 0.57 ± 0.09 | 0.89 ± 0.07 | 0.69 ± 0.09 | 0.68 ± 0.13 | 0.45 ± 0.07 | 0.59 ± 0.08 |
| | With nanogrooves Mobility [$cm^2 V^{-1} s^{-1}$] | 2.7 ± 0.4 | 4.2 ± 0.6 | 4.2 ± 0.4 | 5.5 ± 0.3 | 5.3 ± 0.3 | 6.1 ± 0.6 |
| | Mobility anisotropy of nanogrooved devices [$\mu_{para}/\mu_{perp}$] | 11.9 | 11.1 | 8.4 | 11.0 | 9.0 | 11.4 |

Nanogrooved Substrate Examples

The discussion now focuses on the impact of nanogrooved substrates. A film containing diamond nanoparticles was used to scratch the $SiO_2$ surface to yield parallel nanogrooves, as previously described.[12,13,33] Average µ values and 95% confidence limits from at least 10 devices on multiple substrates for each blend composition and deposition condition are provided in FIGS. 1d and 1e, and are summarized in Table 1. Representative transfer curves for 10% and 100% PCDTPT cast under Condition 1 on nanogrooved substrates are presented in FIG. 1f. Other device characteristics for nanogrooved devices can be found in Figures S2 and S3 in the Supporting Information[42] and their hole mobilities are provided in Tables S1 and S2[42].

Examination of the performance of devices with and without nanogrooves highlights that the nanogrooves improve µ by approximately 4.5 to 11-fold for both deposition methods and all blend compositions (see Table 1). This improvement is noteworthy, relative to previous reports that involve more time-consuming protocols[12,13,33] since the films reported here were deposited by the blade-coating method, which is operationally simple and time-efficient. Blade-coating was already demonstrated to be useful in aligning polymer thin films with this alignment method, as determined by NEXAFS studies, however the mobility from these films was not reported.[34] When casting under Condition 1, µ was 1.9±0.2 $cm^2V^{-1} s^{-1}$ for 10% PCDTPT devices and 2.5±0.2 $cm^2V^{-1} s^{-1}$ for 100% PCDTPT devices. This corresponds to only a ~1.3-fold decrease in µ upon dilution with PS. Even with nanogrooved devices, PS does not seem to impact greatly the mobility of PCDTPT. When casting under Condition 2, µ was 2.7±0.3 $cm^2V^{-1} s^{-1}$ for 10% PCDTPT devices and 6.1±0.4 $cm^2V^{-1} s^{-1}$ for 100% PCDTPT devices. Thus, there appears to be a steeper mobility dependence on composition for these nanogrooved, faster-casting-speed devices than for any other condition used in the study. However, with 25% PCDTPT devices, only a ~1.5-fold decrease was observed when compared to the 100% PCDTPT devices. Steeper declines have been observed in poly(3-hexylthiophene) upon dilution with PS.[17] The high mobility maintained across all PCDTPT:PS compositions once again indicates that PCDTPT maintains good interconnectivity to facilitate charge transport. From a practical perspective, these results demonstrate blade-coating as a facile method of alignment and coating donor-acceptor polymer blend films.

Morphology of the Example Structures

The morphology of the blends was investigated by optical and atomic force microscopies (FIGS. 2a-2c). Optical microscopy was used to visualize the macroscopic features after annealing at 200° C. Micrographs for blend films deposited under Condition 1 atop nanogrooves are shown in FIG. 2a-c. In these images, the bare substrate appears in dark purple regions 200, while PCDTPT thin films are shown in blue-green regions 202. See Figure S4 in the Supporting Information[42] for pristine PCDTPT and bare substrate images for comparison. Attempts to cast films of PS on the DTS-treated $SiO_2$ for comparison show discontinuous films with spherical globules that are characteristic of poor substrate interactions and dewetting (see Figure S4 in the Supporting Information[42]). For 10% PCDTPT films, semi-transparent globules are visible, which are attributed to PS. Smaller PS domains are visible even in 50% films. PS dewetting is well-known to occur upon annealing at high temperatures on silicon substrates[38], and these films were annealed at 200° C. For comparison, a micrograph of a 10% PCDTPT film cast using Condition 2 is shown in Figure S5 in the Supporting Information[42]. To further demonstrate PS dewetting, micrographs of the 10% PCDTPT film before and after annealing are also shown in Figure S5[42]. These images can also be compared to the pristine PCDTPT thin film micrograph (Figure S5[42]). The dewetting of PS serendipitously enables AFM investigation of aligned substructures that the inventors assign to PCDTPT.

FIGS. 2d-2f show the topographic AFM images for 10 wt %, 50 wt % and 90 wt % PCDTPT in PS prepared under Condition 1 onto nanogrooved substrates. AFM imaging locations were chosen to avoid PS globules, as determined from features observed via optical microscopy. Aligned and interconnected fibers are observed in the case of the 10 wt % PCDTPT film, where apparently the majority of the PS has dewetted from the surface. Based on the optical microscopy and AFM images, there is no evidence of PS alignment in the blends. The situation for the 50 wt % and 90 wt % is much less obvious, and it is less clear what can be assigned to either of the two components. The 10% PCDTPT films cast under Condition 2 were also analysed by AFM (Figure S5). Here too, the PS globules were avoided to achieve the AFM imaging. Interconnected fibers favouring the direction of alignment are also observed, again providing evidence for PCDTPT accumulation near the dielectric interface. Furthermore, when comparing AFM images of pristine PCDTPT with unannealed 10% PCDTPT (Figure S5[42]), differences in the structure suggest that PS segregates near the top surface.

Mobility Anisotropy of the Example Structures

The anisotropy of the mobility was obtained by calculating the mobility parallel and perpendicular to the nanogrooves due to its relevance to alignment characterization.[32] Mobility anisotropy is not observed for devices cast onto unmodified substrates (Figure S6 in the Supporting Information[42]). In the case of blade-coated films, it has been shown that alignment of polymer fibers occurs when cast onto nanogrooved substrates,[34] which can result in anisotropy of $\mu$. The $\mu$ anisotropy was calculated for all blend systems by taking the ratio of $\mu$ measured parallel to the direction of the nanogrooves and blade-coating versus the perpendicular direction (Table S1 and Table S2 in the Supporting Information[42] for devices prepared using Conditions 1 and 2, respectively). Figure S6[42] shows representative transfer curves of devices measured parallel and perpendicular to the direction of the nanogrooves. The $\mu$ anisotropy was found to range from ~8-14 in favour of the nanogroove direction. The measured $\mu$ for all devices and mobility anisotropy can be found in the Supporting Information (Tables S1 and S2[42]). These data suggest that the nanogrooves give rise to aligned polymer domains in which the polymer backbones are oriented parallel to their direction. Indeed, aligned polymer fibers can be observed in FIG. 2f for the 10% PCDTPT film. These morphologies are akin to previously observed films prepared on nanogrooved substrates by slower casting techniques.[12,13,33] Such a difference between parallel and perpendicular mobility suggests that PCDTPT interacts strongly with the grooves, in agreement with a preference of the semiconductor to interact with the dielectric surface.

Effect of Annealing on One or More of the Example Structures

Since the annealing temperature of 200° C. is above the glass transition temperature of PS (see Figure S7 in the Supporting Information[42]) and microscopy images (FIG. 2a-c) indicate PS dewetting, it was considered relevant to investigate device performance as a function of annealing temperature and analyse $\mu$ after these thermal transitions. Comparative mobility values between a 50% blend device and a pristine PCDTPT device were used in this inquiry. Both the 50% and pristine PCDTPT devices exhibited a similar upward trend in mobility through the different annealing temperatures (see Figure S8 in the Supporting Information[42]). The average $\mu$, as measured for 3 as-cast devices, was 0.24 cm$^2$V$^{-1}$ s$^{-1}$ (100 wt %) and 0.30 cm$^2$V$^{-1}$ s$^{-1}$ (50 wt %). Upon annealing to 250° C. in steps of 50° C., the performance improved to 3.2 cm$^2$V$^{-1}$ s$^{-1}$ (100 wt %) and 2.8 cm$^2$V$^{-1}$ s$^{-1}$ (50 wt %). This trend suggests that annealing may not be critical to phase separation in this case. The upward trend is consistent with the conclusion that annealing can improve the order within PCDTPT[12] thereby improving $\mu$, which occurs similarly in both cases. As evidenced by similar annealing behaviour in the pristine and blend devices, passing through the glass transition temperature at ~95° C. showed no noticeable effect, and PS dewetting was not necessary to promote PCDTPT interconnectivity.

Crystallinity of One or More of the Example Structures

GIWAXS was used to probe the crystallinity of the films.[39] It is important to note that at the incident angle chosen, GIWAXS probes the bulk of the sample, whereas charge transport in OFETs is typically only relevant in the first few monolayers nearest to the gate dielectric. FIGS. 3a and 3b show the in-plane and out-of-plane GIWAXS data, respectively. As seen in FIG. 3a, PS does not disrupt the π-stacking with the in-plane peak measured ~0.35 nm.[34]

The out-of-plane cake segment (FIG. 3b) shows third-order alkyl stacking peaks even in the 10 wt % blend. High order peaks in blend systems have been previously associated with semiconductor solidification into ordered domains through the processing protocols.[15] X-ray scattering results indicate that PCDTPT retains a similar crystalline state in the blend film as in the pristine film, and is consistent with a strong driving force for phase separation.

Thus, one or more embodiments of the invention have successfully fabricated OFETs that contain mostly an insulator, namely PS, and a donor-acceptor semiconductor. High mobility polymer semiconductor/insulator blend OFETs were fabricated with little impact on the charge carrier mobility. This behaviour is attributed to preferred interactions between PCDTPT and the dielectric layer, as evidenced by 1) dewetting of PS after annealing, 2) improved mobility upon addition of nanogrooves on the dielectric surface, and 3) composition-independent mobility anisotropy. All of these factors suggest that PCDTPT interacts more strongly with the dielectric surface relative to PS. Mobilities as high as 2.7 cm$^2$V$^{-1}$ s$^{-1}$ for blends that contained 90% PS by weight were observed. This value is among the highest reported mobilities for majority-insulator blend systems and is comparable to blends that are used to fabricate single crystal-like OFETs.[40]

Experimental Details for Fabrication of the Example Structures

Device Fabrication:

Diamond lapping films (from Allied High Tech Products, Inc.) with diamond particle size of 100 nm were used to introduce "nanogrooves" on the surface of the thermal SiO$_2$ gate dielectric layer (Si wafers from University Wafer). All substrates scratched were 4-inch wafers cut in half. The adhesion between deionized water, the substrate, and the lapping film, along with a gentle applied pressure facilitated nanogroove formation. A total scratching distance of about 1.5 m was used. Source and drain contacts (5 nm Ni/50 nm Au) were deposited using two-step photolithography. Before polymer deposition, the patterned substrates were cleaned by sonication in acetone and isopropanol for 3 minutes each, and were then dried in an oven under air, at 120° C. for 10 minutes. The substrates were treated with UV-O$_3$ for 15 minutes and underwent acid hydrolysis. Subsequently, the substrates were oven dried, treated again with UV-O$_3$, and then passivated by using decyltrichlorosilane (from Gelest Chemicals) from a 1 vol % toluene solution at 80° C. for 25 minutes. The substrates were then rinsed and sonicated in toluene and dried under nitrogen flow. Blend films were deposited immediately after. The blend concentration was 5 mg/mL with respect to the total PS+PCDTPT content. Stock solutions of PS (Sigma-Aldrich, molecular weight=35,000 g/mol) and PCDTPT (number average molecular weight=50,976, weight average molecular weight=162,135, PDI=3.18) were dissolved in chlorobenzene and mixed by volume to obtain the corresponding blend weight ratio. The molecular weight of PCDTPT was determined using a polystyrene calibrated gel permeation chromatography with Waters 2410 Differential Refract Meter and Waters 2998 Photodiode Array detectors with 0.25 vol. % triethylamine in chloroform as the eluent.

A blade-coat and stage was built using a LTA-HS actuator and integrated CONEX-CC controller. The blade material, blade speed, and blade angle can be modified using this setup. The blades used were glass microscope slides, which were cleaned by piranha solution. The substrate was coated by injecting 8 L of solution in between a ~100 m channel formed between the blade and the substrate. The blade angle was set to 60° relative to the plane of the substrate. Other conditions are specified within the text. Speed and temperature were modified simultaneously to generate continuous and smooth films. At too low of a temperature, device performance may be reduced, while too high of a temperature produced rough films undesirable for morphological characterization. Bottom gate, bottom contact field-effect transistors were fabricated for blend composition ratios of 3%, 10%, 25%, 50%, 75%, 90%, and 100% PCDTPT. The blend solutions were made from parent solutions of pure PCDTPT and PS. Devices were annealed for 200° C. for 8 minutes. The final device architecture (from bottom to top) for these bottom gate, bottom contact field-effect transistors was Si (500 m)/DTS-treated $SiO_2$ (300 nm)/Au (50 nm)/blend layer.

Device Characterization:

The mobilities of blend devices were obtained by fitting the following equation to the saturation regime transfer characteristics: $I_{DS}=(W/2L) C_i \mu (V_{GS}-V_{th})^2$, where W is the channel width (1 or 2 mm), L is the channel length (80 or 160 µm), $C_i$ is the gate dielectric layer capacitance per unit area (10 and 11.5 $nF/cm^2$ for normal and nanogrooved substrates, respectively),[12,13,33] $V_{GS}$ is the gate voltage, $V_{th}$ is the threshold voltage, and $I_{DS}$ is the source-drain voltage. Devices were measured under nitrogen in a glovebox using a Signatone 1160 probe station and Keithley 4200 semiconductor parametric analyzer. Mobility values were calculated from a gate voltage range of ~20 V to −40 V at a source-drain voltage of −80 V. Micrographs were obtained using an Olympus MX51 microscope at 31.5× magnification with differential interference contrast. Tapping-mode atomic force microscopy (AFM) images were obtained in air using an Innova AFM. Differential scanning calorimetry (DSC) was determined by a TA Instruments DSC (Model Q-20) with about 3 mg polymers samples at a rate of 10° C./min in the temperature range of 30 to 330° C. Grazing incidence wide angle X-ray scattering (GIWAXS) measurements were performed at beamline 11-3 at the Stanford Synchrotron Radiation Lightsource (SSRL) with an X-ray wavelength of 0.9744 Å at a 400 mm sample detector distance. Samples were scanned in a He environment at an incident angle of 0.120. The measurements were calibrated using an LaB6 standard. Samples were scanned in a vacuum environment at the listed incidence angles. The measurements were calibrated using an AgB standard. Differential scanning calorimetery measurements were performed using a TA Instruments DSC (Model Q-20).

Advantages and Improvements

Polymer-based organic field-effect transistors have potential applications in flexible and low-cost electronics, such as light-emitting diodes and liquid-crystal displays. However, many current fabrication techniques are cost-intensive, requiring complex film deposition systems and large volumes of expensive semiconductors. By using the outlined methodology, low-cost systems that still obtain high performance can be realized. For example, one or more embodiments of the present invention use a film deposition involving the blade-coating technique, which is operationally simple to use, wastes less material than spin coating and is faster than capillary-driven film formation in a constrained environment.[33] The thin film morphology probed using AFM and GIWAXS, in conjunction with the mobilities attained, also suggests that the semiconducting polymer phase separates to form connected domains that support charge carrier transport. These results have the potential to enable a novel and economically viable route for the fabrication of solution-processable high-mobility OFETs.

Process Steps

Figure 4:
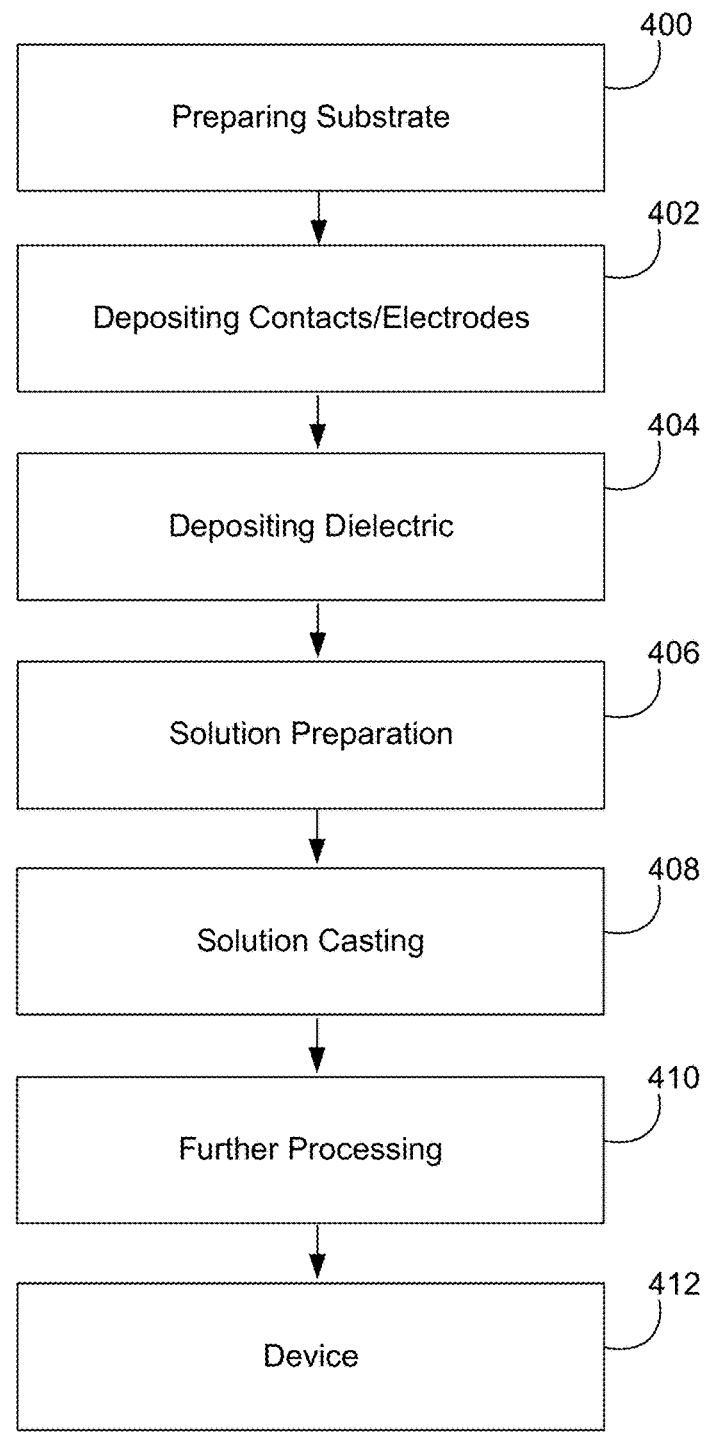
FIG. 4 is a flowchart illustrating a method of fabricating an OFET according to one or more embodiments of the invention.

FIG. 4 is a flowchart illustrating a method for fabricating a device such as an OFET. The method can comprise the following steps.

Block 400 represents obtaining/providing and/or preparing a substrate. The substrate can comprise a flexible substrate (e.g., a plastic, a polymer, a metal, or a glass substrate), for example. In one or more embodiments, the flexible substrate is at least one film or foil selected from a polyimide film, a polyether ether ketone (PEEK) film, a polyethylene terephthalate (PET) film, a polyethylene naphthalate (PEN) film, a polytetrafluoroethylene (PTFE) film, a polyester film, a metal foil, a flexible glass film, and a hybrid glass film.

Block 402 represents optionally forming/depositing contacts or electrodes (e.g., p-type, n-type contacts, or a gate, or source and drain contacts) on or above the substrate.

In an OFET embodiment comprising a top gate & bottom contact geometry, source and drain contacts are deposited on the substrate. The source and drain contacts can comprise gold, silver, silver oxide, nickel, nickel oxide (NiOx), molybdenum, and/or molybdenum oxide, for example. The source and drain contacts of the OFET can further comprise a metal oxide electron blocking layer, wherein the metal can be, but is not limited to nickel, silver or molybdenum.

In an OFET embodiment comprising a bottom gate geometry, a gate electrode is deposited on the substrate. The gate contact (gate electrode) can be a thin metal layer, for example, an aluminum layer, a copper layer, a silver layer, a silver paste layer, a gold layer or a Ni/Au bilayer, or the gate contact can be a thin Indium Tin Oxide (ITO) layer, a thin fluorine doped tin oxide (FTO) layer, a thin graphene layer, a thin graphite layer, or a thin PEDOT:PSS layer. The thickness of the gate electrode may be adjusted (e.g., made sufficiently thin) depending on the flexibility requirement.

The gate, source, and drain contacts can be printed, thermal evaporated or sputtered.

Block 404 represents optionally depositing a dielectric on the gate electrode, e.g., when fabricating an OFET in a bottom gate configuration. In this example, the dielectric is deposited on the gate contact's surface to form a gate dielectric.

The step can comprise forming a coating (e.g., a dielectric coating) or one or more dielectric layers, on the substrate. The dielectric layers can comprise silicon dioxide, a polymer (e.g., PVP) dielectric layer, a polymerized ionic liquid (PIL), or multiple dielectric layers (e.g., a bilayer dielectric). The dielectric layers can be solution coated on the substrate. A single polymer dielectric layer may be preferred in some embodiments (for easier processing, more flexibility). In one embodiment, the dielectric layers can form a polymer/$SiO_2$ bilayer. In another embodiment, the dielectric layers form a polymer dielectric/$SiO_2$/SAM multilayer with the $SiO_2$ on the polymer and the alkylsilane or arylsilane Self Assembled Monolayer (SAM) layer on the $SiO_2$. In another embodiment, the dielectric layers form a $SiO_2$/SAM bilayer with the alkylsilane or arylsilane SAM layer on the $SiO_2$. Various functional groups may be attached to the end of the alkyl groups to modify the surface property of the SAM layer.

The thickness of the coating/dielectric (e.g., $SiO_2$) may be adjusted/selected. For example, the thickness may be adjusted (e.g., made sufficiently thin) depending on the composition of the dielectric layers and the flexibility requirement. For example, in one embodiment, the dielectric layer might not include a polymer dielectric layer and still be flexible.

The dielectric or coating can be structured or patterned to form one or more grooves or structures (such as nanogrooves/nanostructures, e.g., having a depth of 6 nanometers or less and/or a width of 100 nm or less) in the dielectric. The source and drain can be positioned such that a minimum distance between the source contact and drain contact is substantially parallel to the longitudinal axis of the nanogrooves (e.g., a minimum distance between the source contact and drain contact can be substantially parallel to the longitudinal axis of the nanogrooves).

In one or more embodiments, the nanogrooves are formed by nano-imprinting (i.e., the nanogrooves are nanoimprinted into the dielectric or substrate). For example, the step of fabricating the dielectric layers can comprise nano-imprinting a first dielectric layer (e.g., PVP) deposited on the substrate; and depositing a second dielectric layer on the nanoimprinted first dielectric layer, wherein a thickness of the second dielectric layer comprising $SiO_2$ is adjusted.

Block 406 represents preparing a solution comprising one or more semiconducting polymers and one or more insulating polymers.

The step can comprise adding a weight ($W_{IP}$) of the insulating polymers in a solution and adding a weight ($W_{SP}$) of the semiconducting polymers in the solution, wherein $W_{IP}$ is at least 50% of the total weight $W_T = W_{IP} + W_{SP}$. In one or more embodiments, $W_{IP}$ is 50%-60% of $W_T$, 60%-70% of $W_T$, 70%-80% of $W_T$, 80%-90% of $W_T$, 90%-95% of $W_T$, 95%-99% of $W_T$, or 97%-99% of $W_T$. In one or more embodiments, an amount of the insulating polymer in the solution is at least 90 wt % (percentage by weight) based on the total weight (percentage by weight (wt %) of the insulating polymer in the solution is defined as wt %=($W_{IP}$/$W_{TOT}$)×100). The solution comprising the semiconducting polymers and the insulating polymers can be mixed.

The insulating polymer can comprise, but is not limited to, PS. Other examples of insulating polymers include, but are not limited to, polyethylene, polypropylene, polylactic acid, poly(ethylene oxide), poly(methyl methacrylate) and polyvinylpyridine.

The semiconducting polymers can include donor-acceptor semiconducting polymers known in the art or described in one or more of the references cross-referenced herein.

In one or more embodiments, the semiconducting polymers each comprise a (e.g., regioregular) conjugated main chain section, said conjugated main chain section having a repeat unit that comprises a pyridine of the structure:

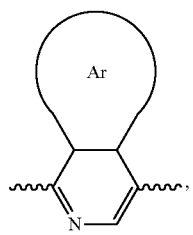

wherein Ar is a substituted or non-substituted aromatic functional group, or Ar is nothing and the valence of the pyridine ring is completed with hydrogen. In one or more embodiments, the pyridine is regioregularly arranged along the conjugated main chain section.

In one or more examples, the pyridine unit has the structure:

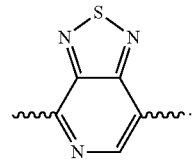

In one or more further embodiments, the semiconducting polymers each comprise polymer chains having a backbone including an aromatic ring, the aromatic ring comprising a side group (e.g., fluorine) having reduced susceptibility to oxidization as compared to a pyridine ring. For example, the semiconducting polymers can have fluoro functionality such as an acceptor structure including a fluorobenzene unit instead of the pyridine unit. For example, the semiconducting polymers can comprise a (e.g., regioregular) conjugated main chain section, the conjugated main chain section having a repeat unit that comprises a compound of the structure:

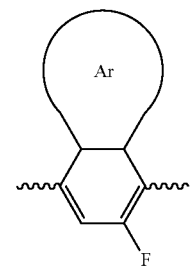

wherein Ar is a substituted or non-substituted aromatic functional group, or Ar is nothing and the valence of the ring comprising fluorine (F) is completed with hydrogen. In one or more embodiments, the ring comprising F is regioregularly arranged along the conjugated main chain section.

In one example, the ring comprising the fluorine has the structure:

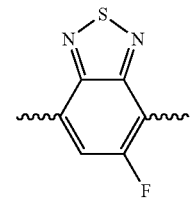

In one or more further embodiments, the repeat unit further comprises a dithiophene of the structure:

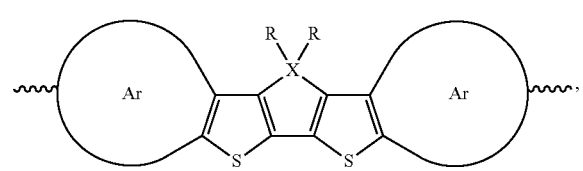

wherein the dithiophene is connected to the pyridine unit or the fluoro-phenyl unit described above, each Ar is independently a substituted or non-substituted aromatic functional group, or each Ar is independently nothing and the valence of its respective thiophene ring is completed with hydrogen, each R is independently hydrogen or a substituted or non-substituted alkyl, aryl or alkoxy chain; and X is C, Si, Ge, N or P. In some embodiments, the R groups can be the same. In the dithiophene, the R comprising the substituted or non-substituted alkyl, aryl or alkoxy chain can be a $C_6$-$C_{50}$ substituted or non-substituted alkyl or alkoxy chain, —$(CH_2CH_2O)_n$ (n=2~30), $C_6H_5$, —$C_nF_{(2n+1)}$ (n=2~50), —$(CH_2)_nN(CH_3)_3Br$ (n=2~50), 2-ethylhexyl, $PhC_mH_{2m+1}$ (m=1-50), —$(CH_2)_nN(C_2H_5)_2$ (n=2~50), —$(CH_2)_nSi(C_mH_{2m+1})_3$ (m, n=1 to 50), or —$(CH_2)_nSi(OSi(C_mH_{2m+1})_3)_x(C_pH_{2p+1})_y$ (m, n, p=1 to 50, x+y=3).

Examples of dithiophene units include those illustrated in Table B (FIG. 30B) in U.S. Utility patent application Ser. No. 14/426,467, filed on Mar. 6, 2015, by Hsing-Rong Tseng, Lei Ying, Ben B. Y. Hsu, Christopher J. Takacs, and Guillermo C. Bazan, entitled "FIELD-EFFECT TRANSISTORS BASED ON MACROSCOPICALLY ORIENTED POLYMERS".

For example, the dithiophene unit can comprise:

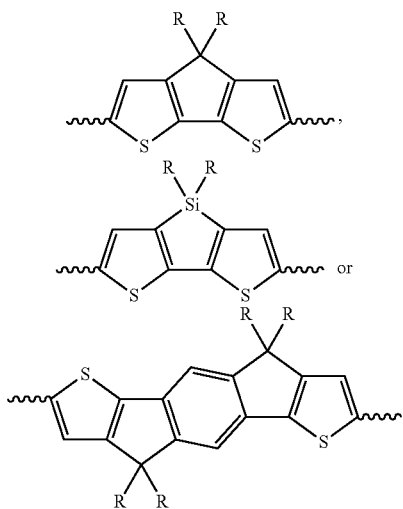

In this way, the acceptor in the semiconducting polymers can comprise the pyridine or the fluorobenzene unit, and the donor in the semiconducting polymers can comprise the dithiophene unit. Further examples of backbones for the semiconducting polymers (including, e.g., PCDTFBT) are described in:

U.S. Provisional Patent Application No. 62/263,058, filed Dec. 4, 2015, by Byoung Hoon Lee, Ben B. Y. Hsu, Chan Luo, Ming Wang, Guillermo Bazan, and Alan J. Heeger, entitled "SEMICONDUCTING POLYMERS WITH MOBILITY APPROACHING ONE HUNDRED SQUARE CENTIMETERS PER VOLT PER SECOND,"(see e.g., FIG. 6 and FIG. 7 and related text);

U.S. Provisional Patent Application No. 62/253,975, filed Nov. 11, 2015, by Ming Wang and Guillermo Bazan, entitled "FLUORINE SUBSTITUTION INFLUENCE ON BENZO[2,1,3]THIODIAZOLE BASED POLYMERS FOR FIELD-EFFECT TRANSISTOR APPLICATIONS";

U.S. Provisional Patent Application No. 62/276,145, filed Jan. 7, 2016, by Michael J. Ford and Guillermo Bazan, entitled "STABLE ORGANIC FIELD-EFFECT TRANSISTORS BY INCORPORATING AN ELECTRON-ACCEPTING MOLECULE";

U.S. Provisional Patent Application No. 62/327,311, filed Apr. 25, 2016, by Guillermo Bazan and Ming Wang, entitled "NOVEL WEAK DONOR-ACCEPTOR CONJUGATED COPOLYMERS FOR FIELD-EFFECT TRANSISTOR APPLICATIONS"; and U.S. Provisional Patent Application No. 62/338,866, filed May 19, 2016, by Michael J. Ford, Hengbin Wang, and Guillermo Bazan, entitled "ORGANIC SEMICONDUCTOR SOLUTION BLENDS FOR SWITCHING AMBIPOLAR TRANSPORT TO N-TYPE TRANSPORT".

In typical embodiments of the invention, the semiconducting polymers comprise a regioregular conjugated main chain section having n=5-5000 (n is an integer) or more contiguous repeat units (e.g., having the alternating structure D-A-D-A, [D-A]n, or [D-A-D-A]n, where D is a donor unit and A is an acceptor unit). In some embodiments, the number of repeat units is in the range of 10-100 repeats. The regioregularity of the conjugated main chain section can be 95% or greater, for example.

Further additives or compositions may be added to the solution, e.g., to form a blend, e.g., as described in U.S. Provisional Patent Application Nos. 62/338,866 and 62/276,145 cross-referenced above.

Block 408 represents solution casting/processing the solution comprising the semiconducting polymers and insulating polymers on or above the substrate or on the dielectric, e.g., to form a film comprising the polymer blend comprising the semiconducting polymers and the insulating polymers.

Solution casting methods include, but are not limited to, inkjet printing, bar coating, spin coating, blade coating, spray coating, roll coating, dip coating, free span coating, dye coating, screen printing, and drop casting.

In one or more embodiments wherein the dielectric or dielectric layers comprise one or more (e.g., uniaxial) nanogrooves, the semiconducting polymers are oriented by the one or more nanogrooves. The structure (e.g., nanogrooves) of dielectric layer can orient the semiconducting polymers comprising polymer chains, e.g., so that polymer chains each have their backbone substantially parallel to a longitudinal axis of at least one of the nanogrooves, and the conduction between the source contact and the drain contact is along the backbones/main chain axes in a direction of the longitudinal axis.

For example, the nanogrooves can provide nucleation sites for growth of the polymer chains within the solution so that one or more of the polymer chains seed and stack within one or more of the nanogrooves. The semiconducting polymers/polymer chains are typically disposed in one or more fibers, wherein the main-chain axes of the polymer chains are aligned along the long-axis of the fiber while π-π stacking of the polymer chains is in a direction along the short-axis of the fiber. In one or more embodiments, the patterned/nanogrooved dielectric increases continuous alignment of one or more of the polymer chains that at least partially lie in the nanogrooves.

The dielectric layers can reduce swelling of the one or more nanogrooves resulting from the solution casting.

Block 410 represents further processing the polymer blend/film cast on the patterned dielectric layers. The step can comprise annealing/curing/drying the polymer blend (or allowing the polymer blend to dry).

In an OFET embodiment comprising a top gate geometry, the step can further comprise depositing the dielectric on the semiconducting polymers and the gate electrode on the dielectric.

In an OFET embodiment comprising a top gate & top contact geometry, the step can further comprise depositing the source and drain contacts to the semiconducting polymers, depositing the dielectric on the semiconducting polymers and the source and drain contacts, and depositing the gate electrode on the dielectric.

Block 412 represents the end result, a device such as an OFET, an organic light emitting device, or a photovoltaic cell. The OFET can comprise a channel/active region on or above the substrate, the channel comprising/consisting essentially of a polymer blend (e.g., cast from a solution comprising semiconducting polymers and an insulating polymers); a source contact and a drain contact to the semiconducting polymers in the polymer blend; and a gate dielectric between a gate and the semiconducting polymers, wherein the gate applies a field to the semiconducting polymers across the dielectric to modulate conduction along a backbone of the semiconducting polymers in the channel between the source contact and the drain contact. A weight of the insulating polymers added in the solution is typically at least 50% of a total weight of the insulating polymer and the semiconducting polymer added in the solution.

Embodiments of the present invention are not limited to the particular sequence of depositing the source, drain, and gate contacts. For example, OFETs according to one or more embodiments of the present invention can be fabricated in a bottom gate & top contact geometry, bottom gate & bottom contact geometry, top gate & bottom contact geometry, and top gate & top contact geometry[43].

In one or more embodiments, the OFET can comprise means (e.g., nanogrooves or statutory equivalents thereof) for aligning the main chain axes to the channel. For example, the means can align the main chain axes to an imaginary line bounded by the source and the drain or the means can align the main chain axes to an alignment direction in the channel (see also U.S. Utility application Ser. No. 15/213,029 filed on Jul. 18, 2016 by Byoung Hoon Lee and Alan J. Heeger, entitled "FLEXIBLE ORGANIC TRANSISTORS WITH CONTROLLED NANOMORPHOLOGY", for further information).

In other embodiments, means for aligning the semiconducting polymers comprises a fabrication method, including, but not limited to, blade coating, dip coating, and bar coating (or statutory equivalents thereof) of the semiconducting polymers on dielectric/substrate.

Thus, various methods can be used to achieve the desired alignment or directed self assembly of the semiconducting polymers. In one or more embodiments, alignment is such that conduction between the source contact and the drain contact is predominantly along the backbones/main chain axes, although charge hopping between adjacent polymers in a fiber bundle is also possible.

The fabrication of the OFET (e.g., selection of a composition of the insulating polymers, composition of the semiconducting polymers, the solution comprising a first concentration of the semiconducting polymers in a solvent and a second concentration of the insulating polymers in the solvent, structure of the nanogrooves, conditions used to align the semiconducting polymers, blade coating speed and a blade coating temperature for the blade coating, drying of the film, and/or an annealing temperature for the annealing) can be such that:

a mobility of the OFET, in a saturation regime, is reduced by no more than 5%, no more than 10%, or no more than 15% when a concentration of the insulating polymer in the solvent is increased from zero to the second concentration (the first concentration of the semiconducting polymers, or the total concentration of the blends remaining the same);

the OFET has a mobility in a saturation regime of at least 2.7 $cm^2V^{-1}$ $s^{-1}$ (e.g., in a range of 2.7 $cm^2V^{-1}$ $s^{-1}$-200 $cm^2V^{-1}$ $s^{-1}$, e.g., for a source drain voltage in a range of −80 V to 1 V and a gate-source voltage in a range of +20 V to −80 V, or for a gate-source voltage in a range of −20 V to −40 V at a source-drain voltage of −80V);

a π-π stacking of the semiconducting polymers in the film/polymer blend is characterized by a peak having a full width at half maximum of 0.1 $Å^{-1}$ or less, as measured by a GIWAXS measurement of the film;

the semiconducting polymers and the insulating polymers are phase separated in the polymer blend and form separate domains, the semiconductor polymers including plurality of interconnected polymer chains;

the semiconducting polymers/polymer chains are disposed/stacked in one or more fibers, wherein the width of an individual fiber is about 2-3 nm, and fibers on the nanostructured/nanogrooved substrate are disposed in fiber bundles having a width of 50~100 nm or at least 50 nm (as compared to fiber bundles having a width between 30~40 nm when fabricated on a non-structured substrate); and/or the semiconducting polymers form crystalline regions (and amorphous/non-crystalline regions) in a film; and/or a tilt, S, of the main-chain axis relative to a normal of the substrate is less than or equal to −0.35 and/or an orientation, η, of the polymer main-chain axis relative to the alignment direction is greater than or equal to 0.96.

Thus, it is unexpectedly found that reducing the content of donor-acceptor semiconducting polymers in the channel (by addition of insulating polymers in the channel) to at most 50% of the total weight of the channel does not significantly reduce mobility of the OFET. Indeed, the inventors of the present invention have shown that an OFET having a channel, comprising at most 50% semiconducting polymer and at least 50% insulating polymer, had its mobility increased (for devices without nanogrooves/alignment) or reduced by only 4%-31% (for devices with nanogrooves/alignment), as compared to an OFET with a channel having 100% semiconducting polymers (no insulating polymers) (see Table 1). The present invention's claimed combination of insulating polymers and semiconducting polymers in an OFET is unexpected and surprising at least because a previous attempt to combine P3HT with PS resulted in at least 30% reduced mobility for the combination consisting of 90% P3HT and 10% PS[17].

One or more embodiments of the present invention do not require any doping or additional processing to obtain composition independent mobility (or to obtain phase separation favorable for composition-independent charge transport). The mobility for all the devices (for all compositions of PS, including 10% semiconductor (PCDTPT) compositions) is reported and obtained without any doping mechanism.

Moreover, one or more embodiments of the invention have achieved, to the best of the inventors' knowledge, the first reported blade-coated blend, the first blend on grooved substrates to achieve semiconductor alignment, and the first donor-acceptor polymer blend. Furthermore, one or more embodiments of the invention have achieved a blend composition including interconnected domains independent of vertical phase separation.

Further information on one or more embodiments of the present invention can be found in reference[44].

REFERENCES

The following references are incorporated by reference herein.
[1] C. Wang, H. Dong, W. Hu, Y. Liu, D. Zhu, *Chem. Rev.* 2012, 112, 2208.
[2] D. Venkateshvaran, M. Nikolka, A. Sadhanala, V. Lemaur, M. Zelazny, M. Kepa, M. Hurhangee, A. J. Kronemeijer, V. Pecunia, I. Nasrallah, I. Romanov, K. Broch, I. McCulloch, D. Emin, Y. Olivier, J. Cornil, D. Beljonne, H. Sirringhaus, *Nature* 2014, 515, 384.
[3] I. Kang, H. J. Yun, D. S. Chung, S. K. Kwon, Y. H. Kim, *J. Am. Chem. Soc.* 2013, 135, 14896.
[4] H. Chen, Y. Guo, G. Yu, Y. Zhao, J. Zhang, D. Gao, H. Liu, Y. Liu, *Adv. Mater.* 2012, 24, 4618.
[5] H. Sirringhaus, *Adv. Mater.* 2014, 26, 1319.
[6] G. Schweicher, V. Lemaur, C. Niebel, C. Ruzié, Y. Diao, O. Goto, W. Y. Lee, Y. Kim, J. B. Arlin, J. Karpinska, A. R. Kennedy, S. R. Parkin, Y. Olivier, S. C. B. Mannsfeld, J. Cornil, Y. H. Geerts, Z. Bao, *Adv. Mater.* 2015, 27, 3066.
[7] Y. Olivier, D. Niedzialek, V. Lemaur, W. Pisula, K. Mullen, U. Koldemir, J. R. Reynolds, R. Lazzaroni, J. Cornil, D. Beljonne, *Adv. Mater.* 2014, 26, 2119.
[8] H. N. Tsao, D. M. Cho, I. Park, M. R. Hansen, A. Mavrinskiy, D. Y. Yoon, R. Graf, W. Pisula, H. W. Spiess, K. Mullen, *J. Am. Chem. Soc.* 2011, 133, 2605.
[9] J. Li, Y. Zhao, H. S. Tan, Y. Guo, C. A. Di, G. Yu, Y. Liu, M. Lin, S. H. Lim, Y. Zhou, H. Su, B. S. Ong, *Sci. Rep.* 2012, 2, 754.
[10] I. McCulloch, M. Heeney, C. Bailey, K. Genevicius, I. MacDonald, M. Shkunov, D. Sparrowe, S. Tierney, R. Wagner, W. Zhang, M. L. Chabinyc, R. J. Kline, M. D. McGehee, M. F. Toney, *Nat. Mater.* 2006, 5, 328.
[11] B. Nketia-Yawson, H. Y. Lee, D. Seo, Y. Yoon, W. T. Park, K. Kwak, H. J. Son, B. Kim, Y. Y. Noh, *Adv. Mater.* 2015, 27, 3045.
[12] H. R. Tseng, L. Ying, B. B. Y. Hsu, L. A. Perez, C. J. Takacs, G. C. Bazan, A. J. Heeger, *Nano Lett*, 2012, 12, 6353.
[13] H. R. Tseng, H. Phan, C. Luo, M. Wang, L. A. Perez, S. N. Patel, L. Ying, E. J. Kramer, T.-Q. Nguyen, G. C. Bazan, A. J. Heeger, *Adv. Mater.* 2014, 26, 2993.
[14] C. D. Dimitrakopoulos, P. R. L. Malenfant, *Adv. Mater.* 2002, 14, 99.
[15] A. D. Scaccabarozzi, N. Stingelin, *J. Mater. Chem. A* 2014, 2, 10818.
[16] S. Goffri, C. Müller, N. Stingelin-Stutzmann, D. W. Breiby, C. P. Radano, J. W. Andreasen, R. Thompson, R. A. J. Janssen, M. M. Nielsen, P. Smith, H. Sirringhaus, *Nat. Mater.* 2006, 5, 950.
[17] A. Babel, S. A. Jenekhe, *Macromolecules* 2004, 37, 9835.
[18] L. Qiu, X. Wang, W. H. Lee, J. A. Lim, J. S. Kim, D. Kwak, K. Cho, *Chem. Mater.* 2009, 21, 4380.
[19] M. Chang, D. Choi, G. Wang, N. Kleinhenz, N. Persson, B. Park, E. Reichmanis, *App. Mater. Interfaces Article* ASAP. DOI: 10.1021/acsami.5b03310
[20] G. Lu, J. Blakesley, S. Himmelberger, P. Pingel, J. Frisch, I. Lieberwirth, I. Salzmann, M. Oehzelt, R. Di Pietro, A. Salleo, N. Koch, D. Neher, *Nat. Comm.* 2013, 4, 1588.
[21] L. Qiu, W. H. Lee, X. Wang, J. S. Km, D. Kwak, S. Lee, K. Cho, *Adv. Mater.* 2008, 21, 1349.
[22] J. A. Lim, J. H. Kim, L. Qiu, W. H. Lee, H. S. Lee, D. Kwak, K. Cho, *Adv. Funct. Mater.* 2010, 20, 3292.
[23] L. Qiu, J. A. Lim, X. Wang, W. H. Lee, M. Hwang, K. Cho, *Adv. Mater.* 2008, 1141.
[24] A. Salleo, A. C. Arias, *Adv. Mater.* 2007, 19, 3540.
[25] A. C. Arias, F. Endicott, R. A. Street, *Adv. Mater.* 2006, 18, 2900.
[26] C. E. Murphy, L. Yang, S. Ray, L. Yu, S. Knox, N. Stingelin, *J. Appl. Phys.* 2011, 110, 093523.
[27] P. M. Beaujuge, J. M. J. Fréchet, *J. Am. Chem. Soc.* 2011, 133, 20009.
[28] V. Coropceanu, J. Corlin, D. A. da Silva Filho, Y. Olivier, R. Silbey, J. L. Brédas, *Chem. Rev.* 2007, 107, 926.
[29] Y. Diao, L. Shaw, Z. Bao, S. C. B. Mannsfeld, *Energy Environ. Sci.*, 2014, 7, 2145.
[30] H. Sirringhaus, R. J. Wilson, R. H. Friend, M. Inbasekaran, W. Wu, E. P. Woo, M. Grell, *Appl. Phys. Lett.* 2000, 77, 406.
[31] M. J. Lee, D. Gupta, N. Zhao, M. Heeney, I. McCulloch, H. Sirringhaus, *Adv. Func. Mater.* 2011, 21, 932.
[32] Y. Yuan, G. Girl, A. L. Ayzner, A. P. Zoombelt, S. C. B. Mannsfeld, J. Chen, D. Nordlund, M. F. Toney, J. Huang, Z. Bao, *Nat. Comm.* 2014, 5, 3005.
[33] C. Luo, A. K. K. Kyaw, L. A. Perez, S. Patel, M. Wang, B. Grimm, G. C. Bazan, E. J. Kramer, A. J. Heeger, *Nano Lett.* 2014, 14, 2764.
[34] S. N. Patel, G. M. Su, C. Luo, M. Wang, L. A. Perez, D. A. Fischer, D. Prendergast, G. C. Bazan, A. J. Heeger, M. L. Chabinyc, E. J. Kramer, *Macromolecules* Accepted.
[35] L. Ying, B. B. Y. Hsu, H. Zhan, G. C. Welch, P. Zalar, L. A. Perez, E. J. Kramer, T.-Q. Nguyen, A. J. Heeger, W. Y. Wong, G. C. Bazan, *J. Am. Chem. Soc.* 2011, 133, 18538.
[36] H. Phan, M. Wang, G. C. Bazan, T.-Q. Nguyen, *Adv. Mater.* 2015, Published online 6 Oct. 2015.
[37] G. Giri, D. M DeLongchamp, J. Reinspach, D. A. Fisher, L. J. Richter, J. Xu, S. Benight, A. Ayzner, M. He, L. Fang, G. Xue, M. F. Toney, Z. Bao, *Chem. Mater.* 2015, 27, 2350.
[38] P. Müller-Buschbaum, M. Stamm, *Macromolecules* 1998, 31, 3686.
[39] A. Salleo, R. J. Kline, D. M. DeLongchamp, M. L. Chabinyc, *Adv. Mater.* 2010, 22, 3812.
[40] A. Hamguchi, T. Negishi, Y. Kimura, Y. Ikeda, K. Takimiya, S. Z. Bisri, Y. Iwasa, T. Shiro, *Adv. Mater.* 2015, Published online 29 Sep. 2015.
[42] "Supporting Information High Mobility Organic Field-Effect Transistors from Majority Insulator Blend Solutions" by Michael J. Ford, Ming Wang, Shrayesh N. Patel, Hung Phan, Rachel A. Segalman, Thuc-Quyen Nguyen, Guillermo C. Bazan." Figures S1-S10 and Tables S1-S2, are in this reference.
[43] DiBenedetto et. al., Molecular Self-Assembled Monolayers and Multilayers for Organic and Unconventional Inorganic Thin-Film Transistor Applications, Adv. Mater. 2009, 21, 1407-1433 DOI 10.1002/adma.200803267.
[44] "High Mobility Organic Field-Effect Transistors from Majority Insulator Blends" by Michael J. Ford et. al., *Chem. Mater.*, 2016, 28 (5), pp 1256-1260, DOI: 10.1021/acs.chemmater.5b04774.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An organic field effect transistor (OFET), comprising:
a film comprising semiconducting polymers and insulating polymers, wherein:
a total weight ($W_{IP}$) of the insulating polymers in the film is at least 50% of a total weight ($W_{TOT}$) of the film,
a total weight of the semiconducting polymers in the film is at most 50% of the total weight of the film ($W_{TOT}$), and
the semiconducting polymers each have a donor-acceptor copolymer backbone,
the film comprises a polymer blend of the semiconducting polymers and the insulating polymers,
the semiconducting polymers and the insulating polymers are phase separated in the film and form separate domains, and
the semiconducting polymers include a plurality of interconnected polymer chains;
a source contact and a drain contact to the semiconducting polymers;
a gate contact; and
a dielectric between the gate contact and the semiconducting polymers, wherein the dielectric is nearer to the semiconducting polymers than the insulating polymers.

2. The OFET of claim 1, wherein $W_{IP}$ is at least 90% of the total weight ($W_{TOT}$).

3. The OFET of claim 1, wherein the film is cast on or above a substrate or the dielectric, from a solution comprising a first concentration of the semiconducting polymers in a solvent and a second concentration of the insulating polymers in the solvent, such that a mobility of the OFET, in a saturation regime, is reduced by no more than 10% when:
a concentration of the insulating polymers in the solvent is increased from zero to the second concentration, and
the first concentration of the semiconducting polymers, or the total concentration of the blends remains the same.

4. The OFET of claim 1, wherein the total weight of the insulating polymers is such that the OFET has a mobility in a saturation regime of at least 2.7 cm$^2$ V$^{-1}$ s$^{-1}$.

5. The OFET of claim 1, wherein the insulating polymers comprise a commodity polymer.

6. The OFET of claim 1, wherein the insulating polymers comprise at least one compound selected from polystyrene, polyethylene, polypropylene, polylactic acid, poly(ethylene oxide), poly(methyl methacrylate) and polyvinylpyridine.

7. The OFET of claim 1, wherein semiconducting polymers comprise a conjugated main chain section, said conjugated main chain section having a repeat unit that comprises at least one acceptor structure selected from:

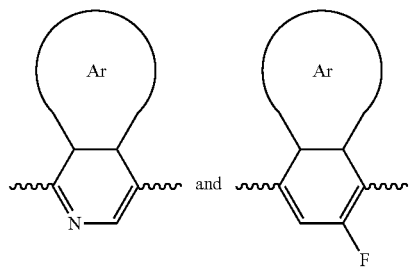

251658240 wherein Ar is a substituted or non-substituted aromatic functional group, or Ar is nothing and the valence of the pyridine ring is completed with hydrogen or the valence of the fluorobenzene ring is completed with hydrogen.

8. The OFET of claim 7, wherein:
the pyridine unit comprises:

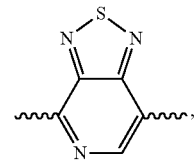

251658240 or
the fluorinated unit comprises:

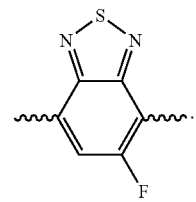

9. The OFET of claim 7, wherein the repeat unit further comprises a dithiophene of the structure:

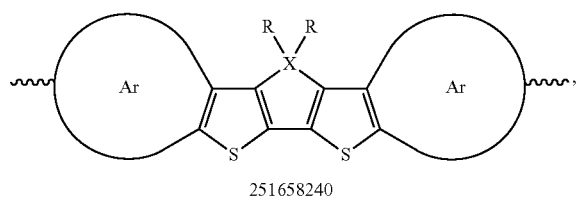

251658240 wherein each Ar is independently a substituted or non-substituted aromatic functional group, or each Ar is independently nothing and the valence of its respective thiophene ring is completed with hydrogen,
each R is independently hydrogen or a substituted or non-substituted alkyl, aryl or alkoxy chain; and
X is C, Si, Ge, N or P.

10. The OFET of claim 1, wherein the semiconducting polymers are regioregular poly[4-(4,4-dihexadecyl-4H-cyclopenta[1,2-b:5,4-b']dithiophen-2-yl)-alt-[1,2,5]thiadiazolo[3,4-c]pyridine] (PCDTPT).

11. The OFET of claim 1, wherein the semiconducting polymers are regioregular poly[4-(4,4-dihexadecyl-4H-cyclopenta[1,2-b:5,4-b']dithiophen-2-yl)-6-fluorobenzo[c][1,2,5]thiadiazole] (PCDTFBT).

12. The OFET of claim 1, wherein the film is blade coated from a solution onto a dielectric or substrate.

13. The OFET of claim 1, wherein a π-π stacking of the semiconducting polymers in the film is characterized by a peak having a full width at half maximum of 0.1 Å$^{-1}$ or less, as measured by a grazing incidence wide-angle X-ray scattering (GIWAXS) measurement of the film.

14. The OFET of claim 1, wherein the dielectric comprises nanogrooves aligning the semiconducting polymers to an alignment direction in the channel.

15. The OFET of claim 1, wherein the semiconducting polymers comprise aligned semiconducting polymer chains in a crystalline state.

16. A method for fabricating an organic field effect transistor (OFET), comprising:
   solution processing a film comprising semiconducting polymers and insulating polymers on a dielectric, wherein:
      a total weight ($W_{IP}$) of the insulating polymers in the film is at least 50% of a total weight ($W_{TOT}$) of the film,
      a total weight of the semiconducting polymers in the film is at most 50% of the total weight, and
      the semiconducting polymers each have a donor-acceptor copolymer backbone,
      the film comprises a polymer blend of the semiconducting polymers and the insulating polymers,
      the semiconducting polymers and the insulating polymers are phase separated in the film and form separate domains, and
      the semiconducting polymers include a plurality of interconnected polymer chains;
   providing a source contact and a drain contact to the semiconducting polymers; and
   providing a gate contact;
   wherein the dielectric is between the gate contact and the semiconducting polymers and nearer to the semiconducting polymers than the insulating polymers.

17. The method of claim 16, wherein the solution processing includes blade coating a solution onto the dielectric.

18. The method of claim 17, further comprising annealing the polymer blend or allowing the polymer blend to dry.

19. The method of claim 18, further comprising:
   selecting a composition of the insulating polymers, a composition of the semiconducting polymers, the solution comprising a first concentration of the semiconducting polymer in a solvent and a second concentration of the insulating polymer in the solvent;
   selecting a blade coating speed and a blade coating temperature for the blade coating; and
   selecting an annealing temperature for the annealing;
   wherein:
      a mobility of the OFET, in a saturation regime, is reduced by no more than 10% when:
         a concentration of the insulating polymer in the solvent is increased from zero to the second concentration, and
         the first concentration of the semiconducting polymer, or the total concentration of the blends solution remains the same.

20. The method of claim 19, further comprising blade coating the film from the solution on the dielectric comprising nanogrooves, at a speed of at least 0.1 to 1 mm/s at a temperature of at least 50 to 100 degrees Celsius.

* * * * *